US008009392B2

(12) United States Patent
Kanaya et al.

(10) Patent No.: US 8,009,392 B2
(45) Date of Patent: Aug. 30, 2011

(54) THIN FILM MAGNETIC HEAD AND MAGNETIC DISK DEVICE

(75) Inventors: Takayasu Kanaya, Tokyo (JP); Kei Hirata, Tokyo (JP); Yohei Koyanagi, Tokyo (JP); Seiichi Takayama, Tokyo (JP); Shinji Hara, Tokyo (JP); Toshiyuki Ayukawa, Tokyo (JP)

(73) Assignee: TDK Corporation, Tokyo (JP)

( * ) Notice: Subject to any disclaimer, the term of this patent is extended or adjusted under 35 U.S.C. 154(b) by 426 days.

(21) Appl. No.: 12/318,924

(22) Filed: Jan. 13, 2009

(65) Prior Publication Data

US 2010/0177440 A1   Jul. 15, 2010

(51) Int. Cl.
*G11B 5/33* (2006.01)
*G11B 5/48* (2006.01)
*G11B 5/60* (2006.01)

(52) U.S. Cl. .............. 360/324.12; 360/245.3; 360/234.3
(58) Field of Classification Search ............... 360/234.3, 360/245.3, 324.12
See application file for complete search history.

(56) References Cited

FOREIGN PATENT DOCUMENTS

JP    A-2008-84446    4/2008
JP    A-2008-97700    4/2008

*Primary Examiner* — Ly D Pham
(74) *Attorney, Agent, or Firm* — Posz Law Group, PLC

(57) ABSTRACT

Foundation layers of a thin film magnetic head are disposed between insulating layers and bias magnetic field application layers, and are configured of Cr or Cr alloy. The insulating layers are configured of a Si oxide such that the Si content of the Si oxide is in the range of 30~56 at % (atom %) and that the atom ratio of oxygen to Si (O/Si) is in the range of 0.8~1.3. With the configuration, the occurrence rate of noise is reduced.

13 Claims, 7 Drawing Sheets

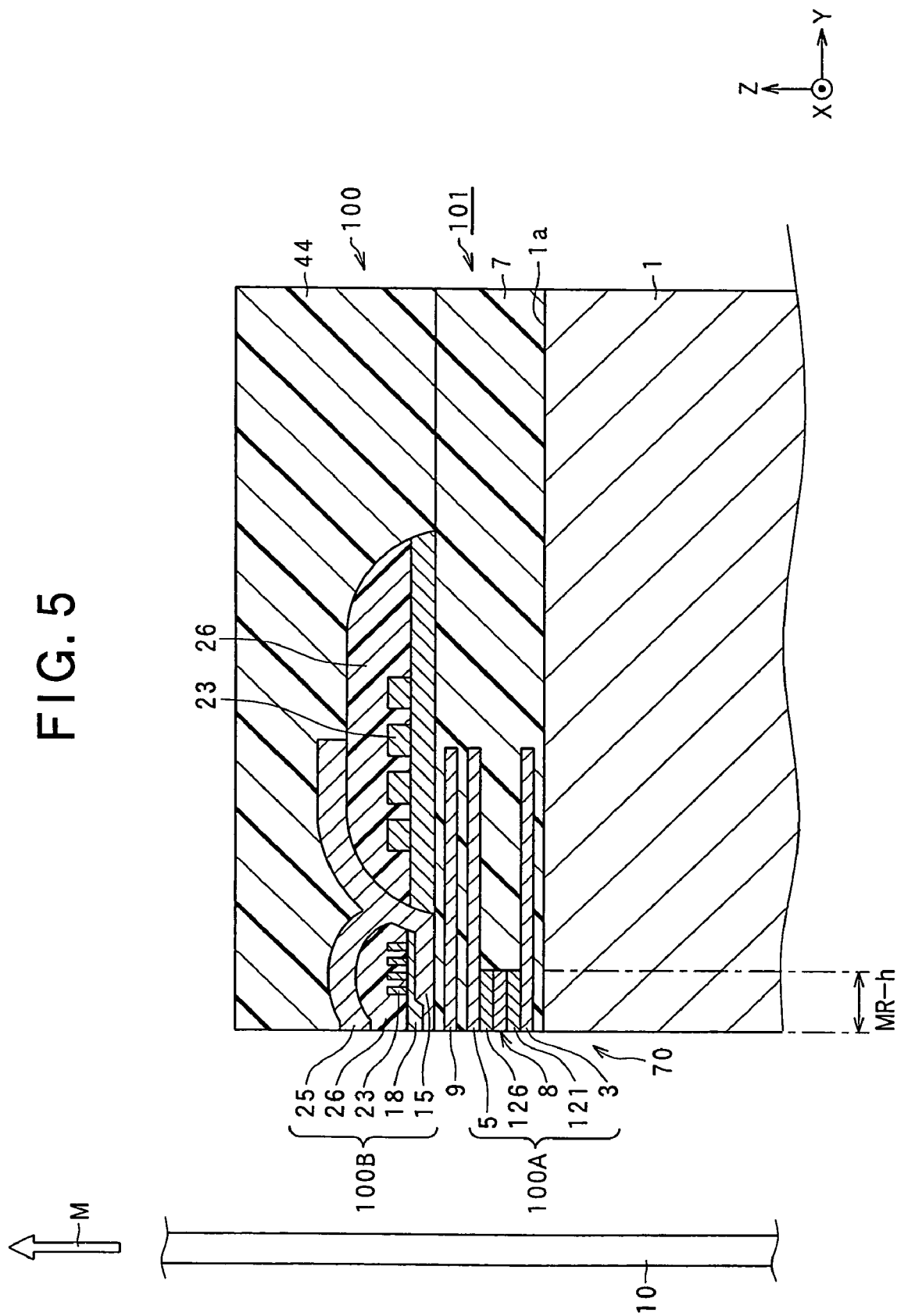

FIG. 6
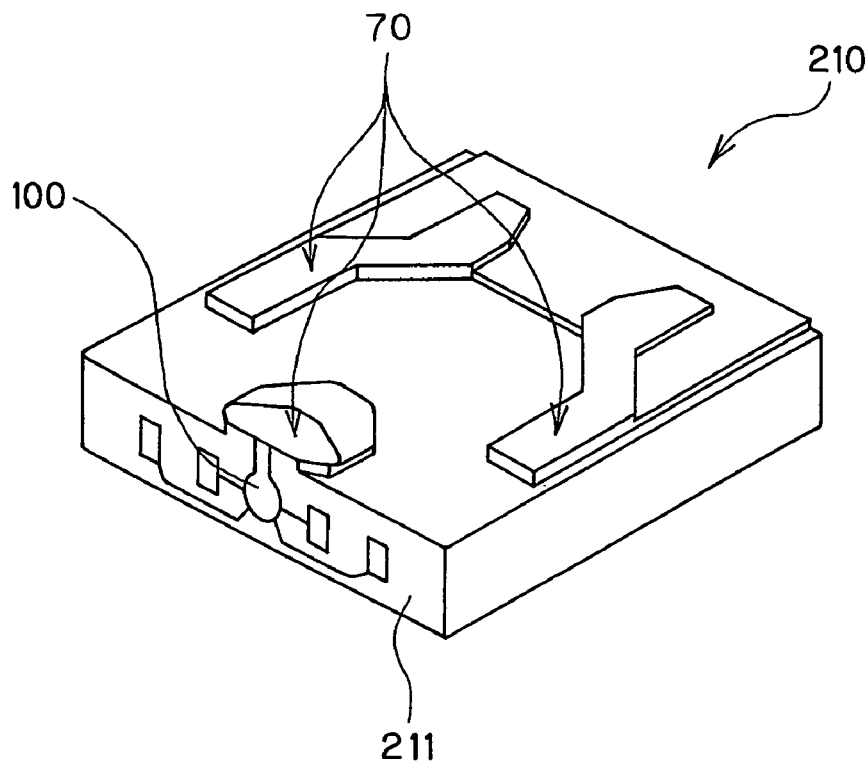
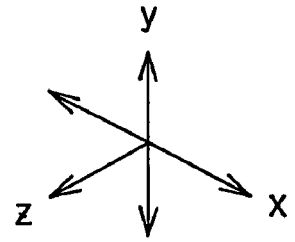
FIG. 7
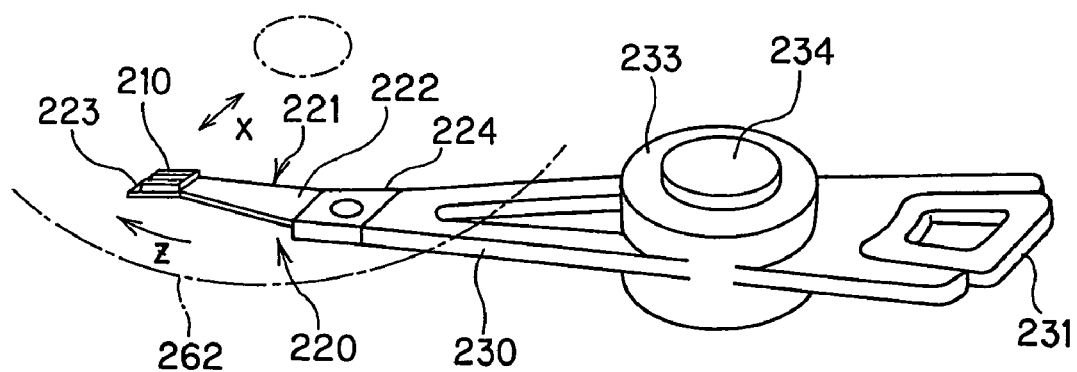

THIN FILM MAGNETIC HEAD AND MAGNETIC DISK DEVICE

BACKGROUND OF THE INVENTION

1. Field of the Invention

The present invention relates to a thin film magnetic head including a magneto-resistive effect element having a CPP structure for reading magnetic field strengths of a magnetic recording medium or the like as signals. Also, the invention relates to a head gimbal assembly and a magnetic disk device including the thin film magnetic head.

2. Description of the Related Art

As the surface recording density of a magnetic disk device has lately been advanced, there is a need for enhancing the performance of a thin film magnetic head. As a thin film magnetic head, a complex type thin film magnetic head has widely been used that has a structure of a reproducing head having a read-only magneto-resistive (MR) effect element (hereinafter also referred to as an MR element) and a recording head having a write-only magnetism conversion element layered on a substrate.

MR elements include an anisotropic magneto-resistive (AMR) element using the AMR effect, a giant magneto-resistive (GMR) element using the GMR effect and a tunnel magneto-resistive (TMR) element using the TMR effect.

The characteristics of a reproducing head should particularly be high sensitivity as well as high output. As a reproducing head that satisfies such requirements, a GMR head using a spin-valve type GMR element has already been mass-produced.

Moreover, a GMR element having a structure that allows a sense current to flow in the perpendicular direction (layering direction) relative to the surface of each layer configuring the GMR element, that is, a current perpendicular to plane (CPP) structure (a CPP-MR element) has been developed as a next generation element. A TMR element that has already been mass-produced and put into practical use falls under the category of CPP-MR elements as well.

An MR element is placed between upper and lower shield layers formed of soft magnetic metal films and is disposed in a manner of being sandwiched between insulating layers referred to as gap layers. The recording density of bit direction is defined by a shield gap (also known as read gap length) between the upper and lower shield layers. As the recording density has lately increased, there is an increased need for a narrow shield gap or narrow track for the reproducing element of a reproducing head.

In the thin film magnetic head including such a magneto-resistive effect element, a bias magnetic field application layer is disposed on each of two sides of an MR element. These bias magnetic application layers allow application of a so-called vertical bias to a free layer configuring part of the element. As a result, the generation of noise can be suppressed, thus allowing the operation of detecting a predetermined external magnetic field.

Therefore, the magnetic characteristics of the bias magnetic field application layers (e.g., retentivity, residual magnetic field and squareness ratio) are very important for securing the characteristics and reliability of the MR head. If residual magnetization is small, a magnetic field applied to the free layer for magnetic field response control becomes insufficient, which causes the variation of the symmetry of reproduced waveforms as well as Barkhausen noise. If retentivity is small, a bias magnetic field tends to be reduced under influences of a magnetic field applied from shield layers disposed on the upper and lower portions of an element or influences from a recording medium, resulting in the variation of the symmetry of reproduced waveforms as well as Barkhausen noise like the case as described above. These types of problems are particularly noteworthy where the element has a structure in which a gap between the shield layers disposed on the upper and lower portions of the element is extremely small (i.e., a narrow shield gap).

In order to form bias magnetic field application layers, insulating layers are usually provided first on both side parts of an MR element. Subsequently, foundation layers are formed on the insulating layers and then bias magnetic field application layers on the foundation layers (Japanese laid-open application numbers 2008-97700 and 2008-84446).

Japanese laid-open application number 2008-97700, which is the prior art, discloses the use of $SiO_2$, AlN, $Si_3N_4$, SiN, etc. for insulating layers as well as Cr, CrTi, CrMo, CrV, W, TiW, etc. for foundation layers.

Moreover, Japanese laid-open application number 2008-84446, which is also the prior art, discloses alumina for insulating layers as well as the use of Cr or CrTi for foundation layers.

Nevertheless, there is some possibility that the magnetic characteristics of the bias magnetic field application layers (e.g., retentivity, residual magnetic field and squareness ratio) will significantly change by the design specification of the layer configuration of insulating layers and foundation layers even though magnetic materials may remain the same. Accordingly, there remains a need to further improve the specification of the insulating layers and the foundation layers.

Under such circumstances, the present invention was made. The object of the present invention is to propose a novel thin film magnetic head incorporating a new design specification for the layer configuration of insulating layers and foundation layers relating to bias magnetic field application layers, which decrease the rate of occurrence of noise. Moreover, it is to propose a novel thin film magnetic head incorporating a new design specification for the layer configuration of insulating layers and foundation layers relating to bias magnetic field application layers, which is superior in thermal stability after annealing treatment.

SUMMARY OF THE INVENTION

In order to solve the above-mentioned problems, the thin film magnetic head of the present invention has a magneto-resistive (MR) effect element having: an MR effect film formed by sequentially layering a magnetic pinned layer, a nonmagnetic layer and a free layer, and bias magnetic field application layers formed at junction tapered parts formed on both end parts of the MR effect film in a width direction via insulating layers and foundation layers, wherein the free layer is configured to change its magnetization direction in accordance with an external magnetic field, a magnetization direction of the magnetic pinned layer is pinned, and the bias magnetic field application layers are configured to apply a vertical bias magnetic field to the free layer, the foundation layers are disposed between the insulating layers and the bias magnetic field application layers, and are configured of Cr or Cr alloy, and the insulating layers are configured of a Si oxide such that the Si content of the Si oxide is in the range of 30~56 at % (atom %) and that the atom ratio of oxygen to Si (O/Si) is in the range of 0.8~1.3.

As a preferred embodiment of the thin film magnetic head of the present invention, the Si oxide is at least one type selected from the group consisting of SiOx, SiOxN and SiAlOxN.

As a preferred embodiment of the thin film magnetic head of the present invention, the foundation layers are at least one type selected from the group consisting of Cr, CrTi, CrMo, CrV, CrW and CrTa.

As a preferred embodiment of the thin film magnetic head of the present invention, the insulating layers are 1.5~10 nm in thickness.

As a preferred embodiment of the thin film magnetic head of the present invention, the foundation layers are 1.5~6.5 nm in thickness.

As a preferred embodiment of the thin film magnetic head of the present invention, the bias magnetic field application layers are configured of Co system hard magnetic layers.

As a preferred embodiment of the thin film magnetic head of the present invention, the bias magnetic field application layers are 10~20 nm in thickness.

The thin film magnetic head of the present invention has a magneto-resistive (MR) effect element having an MR effect film formed by sequentially layering a magnetic pinned layer, a nonmagnetic layer and a free layer; and bias magnetic field application layers formed at junction tapered parts formed on both end parts of the MR effect film in a width direction via insulating layers and foundation layers; wherein the free layer is configured to change magnetization directions in accordance with an external magnetic field, a magnetization direction of the magnetic pinned layer is pinned, the bias magnetic field application layers are configured to apply a vertical bias magnetic field to the free layer, the foundation layers are disposed between the insulating layers and the bias magnetic field application layers, and are configured of Cr or Cr alloy, the insulating layers have a two-layer structure of a lower insulating layer and a upper insulating layer sequentially viewed from the junction tapered part side, the lower insulating layers are configured of at least one type selected from the group consisting of $Al_2O_3$, AlN and MgO, the upper insulating layers are configured of a Si oxide such that the Si content of the Si oxide is in the range of 30~56 at % (atom %) and that the atom ratio of oxygen to Si (O/Si) is in the range of 0.8~1.3, and thicknesses of the lower insulating layers and the upper insulating layers are each not less than 1.5 nm.

As a preferred embodiment of the thin film magnetic head of the present invention, the thicknesses of the lower insulating layers and the upper insulating layers are each in the range of 1.5 nm ~5.0 nm.

As a preferred embodiment of the thin film magnetic head of the present invention, the Si oxide configuring the upper insulating layers is at least one type selected from the group consisting of SiOx, SiOxN and SiAlOxN.

As a preferred embodiment of the thin film magnetic head of the present invention, the foundation layers are at least one type selected from the group consisting of Cr, CrTi, CrMo, CrV, CrW and CrTa.

The head gimbal assembly of the present invention has a slider comprising the above mentioned thin film magnetic head, and disposed in a manner of being opposed to a recording medium, and a suspension for elastically supporting the slider.

The magnetic disk device of the present invention has a slider comprising the above mentioned thin film magnetic head, and disposed in a manner of being opposed to a recording medium, and a positioning device for supporting and positioning the slider with respect to the recording medium.

BRIEF DESCRIPTION OF THE DRAWINGS

FIG. 5 is a sectional view explaining the configuration of the thin film magnetic head according to one preferred embodiment of the present invention and illustrating a cross section perpendicular to the substrate and the medium-opposed surface of the thin film magnetic head.

FIG. 6 is a perspective view illustrating a slider mounted in the head gimbal assembly according to one embodiment of the present invention.

FIG. 7 is a perspective view illustrating a head arm assembly including the head gimbal assembly according to one embodiment of the present invention.

DETAILED EXPLANATION OF THE INVENTION

A description of the best mode for implementing the present invention is given below in detail.

Figure 1:
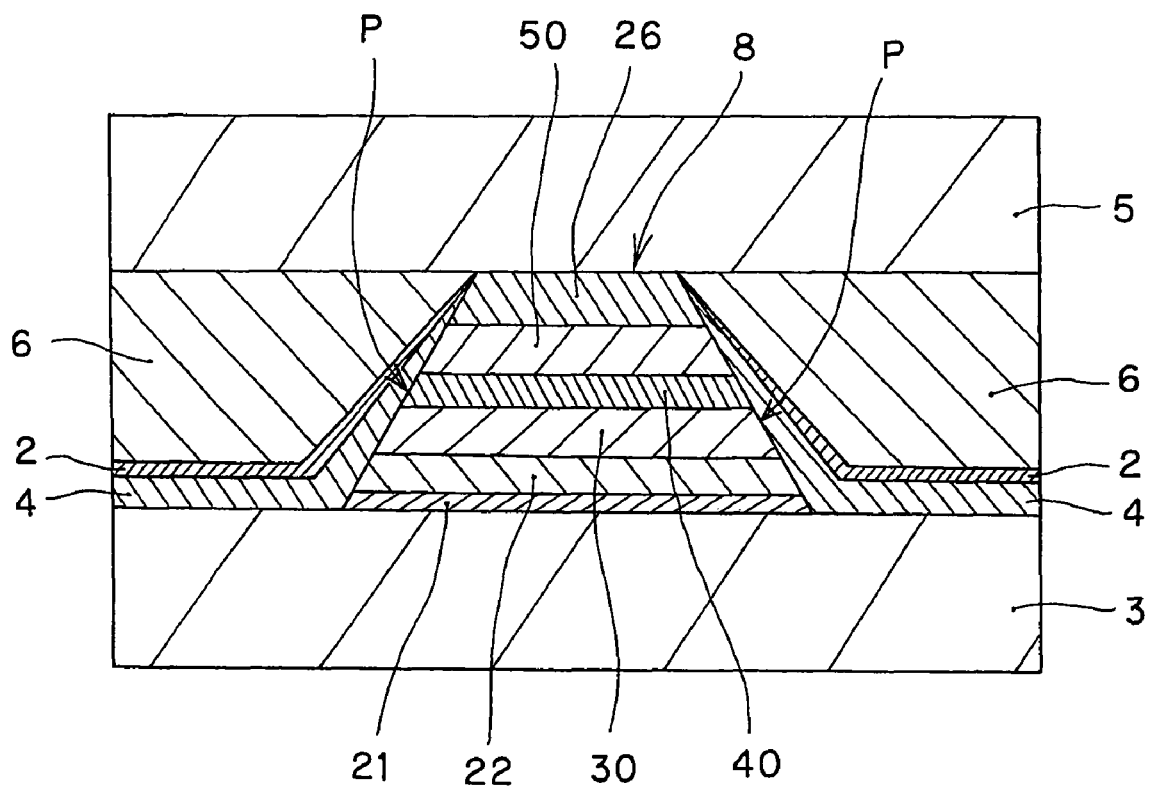
FIG. 1 is a sectional view mainly illustrating the cross section parallel to a medium-opposed surface of a reproducing head in the first embodiment of the present invention.

FIG. 1 is an air bearing surface (ABS) of a reproducing head according to a first embodiment of the present invention. The ABS is equivalent to the surface of a reproducing head opposed to a recording medium (also referred to as a medium-opposed surface). The ABS according to the scope of the present invention includes a cross section of a position at which the layered structure of an element can clearly be observed, and therefore a protecting layer such as DLC (i.e., a protecting layer covering an element) positioned at the medium-opposed surface in a strict sense can be excluded as needed, for example.

Figure 2:
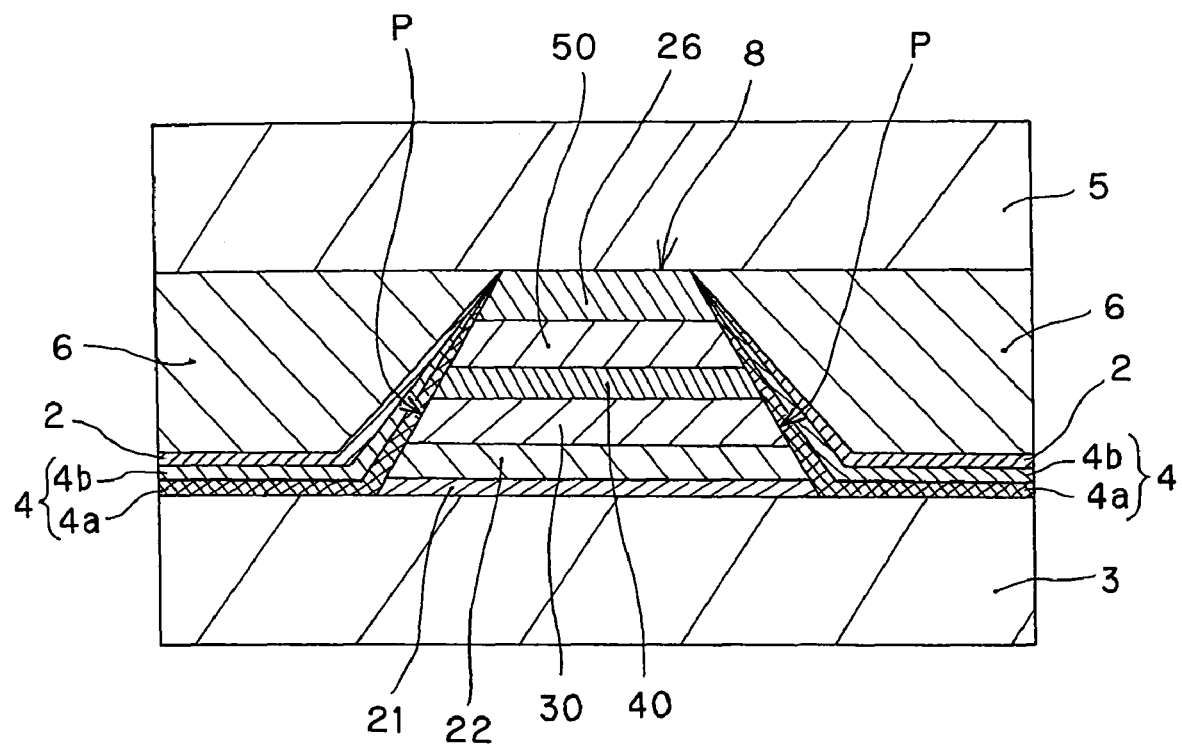
FIG. 2 is a sectional view mainly illustrating the cross section parallel to the medium-opposed surface of a reproducing head in the second embodiment of the present invention.

FIG. 2 is a view from the air bearing surface (ABS) of the reproducing head according to a second embodiment of the present invention.

In the following explanation of the present invention, the size in the direction of the X-axis in the drawings is referred to as "width," the size in the direction of the Y-axis is referred to as "length," and the size in the direction of the Z-axis is referred to as "thickness," respectively. In the direction of the Y-axis, the side close to the ABS and its opposite side (back side) are described as "anterior (or forward)" and "posterior (or backward)," respectively. The direction of piling up a layered layer and its opposite direction are referred to as "upward" or "up side" and "downward" or "down side," respectively.

Explanation of First Embodiment

A description of the first embodiment of a reproducing head (thin film magnetic head) having the MR element according to the present invention is given below in detail by referring to FIG. 1.

MR elements include an AMR element using the anisotropic magneto-resistive effect, a GMR element using the giant magneto-resistive effect and a TMR element using the tunnel-type magneto-resistive effect.

In the present embodiment, a GMR element having a structure that allows a sense current to flow in the perpendicular direction (layering direction) relative to the surface of each layer forming the element, that is, a current perpendicular to plane (CPP) structure (a CPP-GMR element) is used as a preferred example of MR elements.

The reproducing head according to the present embodiment has a first shield layer 3 (also referred to as "a lower shield layer 3") and a second shield layer 5 (also referred to as "an upper shield layer 5") that are disposed in a manner of being opposed to each other up and down in the drawing at a predetermined distance as shown in FIG. 1 and an MR element 8 (also referred to as "a CPP-GMR element 8") disposed between the first shield layer 3 and the second shield layer 5.

Moreover, as shown in FIG. 1, junction tapered parts P are formed on both end parts of the CPP-GMR element 8 (magneto-resistive effect film) in the width direction (X direction) (i.e., two sides of the CPP-GMR element 8). A pair of bias magnetic field application layers 6 are formed on both end parts of the junction tapered parts P. The bias magnetic field application layers 6 are configured to apply a vertical bias magnetic field to a free layer 50 that is described below via insulating layers 4.

As shown in FIG. 1, foundation layers 2 are formed between the bias magnetic field application layers 6 and the insulating layers 4. The foundation layers 2 function to control the crystallizability and orientation of the bias magnetic field application layers 6.

The first shield layer 3 and the second shield layer 5 in the present embodiment serve as so-called magnetic shields as well as a pair of electrodes. In other words, in addition to the function of magnetic shields, they also function as a pair of electrodes to allow a sense current to flow through the CPP-GMR element 8 in the direction of crossing the surface of each layer configuring the CPP-GMR element 8, that is, in the direction perpendicular to (i.e., in the layering direction of) the surface of each layer configuring the CPP-GMR element 8.

Apart from the first shield layer 3 and the second shield layer 5, a pair of electrodes may newly be formed above the upper portion and the below the lower portion of the CPP-GMR element 8.

The CPP-GMR element 8 of the reproducing head as shown in FIG. 1 is configured as a multi-layered film formed by sequentially layering an antiferromagnetic layer 22 as a pinning layer formed on the first shield layer 3 via a foundation layer 21, a magnetic pinned layer 30 formed on the antiferromagnetic layer 22, a nonmagnetic layer 40 formed on the magnetic pinned layer 30, a free layer 50 formed on the nonmagnetic layer 40 and a cap layer 26 (protecting layer 26) formed on the free layer 50.

This multi-layered film is sandwiched between the first shield layer 3 and the second shield layer 5 and allows a sense current to flow in the thickness direction of the multi-layered film by applying a voltage between the first shield layer 3 and the second shield layer 5.

The free layer 50 is a magnetic layer whose magnetization direction changes in accordance with an external magnetic field.

The magnetic pinned layer 30 is a magnetic layer whose magnetization direction is pinned by the antiferromagnetic layer 22 that produces the pinning effect.

A description of each layer configuring the CPP-GMR element 8 is given below in more detail.

(Explanation of Magnetic Pinned Layer 30)

The magnetic pinned layer 30 according to the present invention is formed on the antiferromagnetic layer 22 that is formed via the foundation layer 21 formed on the first shield layer 3 in order to produce the pinning effect.

The magnetic pinned layer 30 may be either a single layer configuration or a multiple layer configuration.

A description of a multiple layer configuration, which is the preferable embodiment, is given below. The magnetic pinned layer 30 is formed by sequentially layering an outer layer, a nonmagnetic intermediate layer and an inner layer from the side of the antiferromagnetic layer 22 in a manner of forming a so-called synthetic pinned layer. The outer layer and the inner layer may be configured of ferromagnetic materials containing Co or Fe, for example. The outer layer and the inner layer are antiferromagnetically coupled in a manner that allows their magnetization directions to be opposite to each other.

It is preferred that the outer layer and the inner layer are alloy layers containing $Co_{70}Fe_{30}$ (atom %), for example. It is preferred that the outer layer is about 3~7 nm in thickness and the inner layer about 3~10 nm in thickness. The nonmagnetic intermediate layer is configured of nonmagnetic materials containing at lease one type selected from the group consisting of Ru, Rh, Ir, Re, Cr, Zr and Cu. The nonmagnetic intermediate layer is about 0.35~1.0 nm in thickness, for example. The nonmagnetic intermediate layer is provided to pin the magnetization of the inner layer and the magnetization of the outer layer in opposite directions.

(Explanation of Free Layer 50 and Cap Layer 26)

The free layer 50 is a layer whose magnetization direction changes (or varies) in accordance with an external magnetic field (i.e., a signal magnetic field from a recording medium) and is configured of a ferromagnetic layer having a small retentivity (soft magnetic layer). The free layer 50 is about 2~10 nm in thickness, for example. The free layer 50 may be configured either as a single layer or as a multi-layered film including multiple ferromagnetic layers.

A cap layer 26 (protecting layer 26) of a Ta or Ru layer, for example, is formed on such a free layer 50, as shown in FIG. 1. The layer is about 0.5~20 nm in thickness.

(Explanation of Nonmagnetic Layer 40)

In case of the TMR element, the nonmagnetic layer 40 may be formed of oxides, nitrides or the like of Al, Ni, Gd, Mg, Ta, Mo, Ti, W, Hf or Zr.

In the CPP-GMR element, the following material may be used: Cu, Ag, Au, Ru, Rh, Ir, Re, Cr, Zr, Al, Mg, Mn, Nb, Pd, Pt, Ta, Ti and V. It may be a layered body made of Zn/ZnO/Cu or the like. Its thickness is about 0.3~2.0 nm.

(Explanation of Antiferromagnetic Layer 22)

The antiferromagnetic layer 22 that functions as a pinning layer acts in a manner of pinning the magnetization direction of the magnetic pinned layer 30 by the exchange-coupling with the magnetic pinned layer 30 as described above.

The antiferromagnetic layer 22 is configured of at least one type of element M' selected from the group consisting of Pt, Ru, Rh, Pd, Ni, Cu, Ir, Cr and Fe, and is configured of antiferromagnetic materials containing Mn. It is preferred that the content of Mn is 35~95 atom %. Antiferromagnetic materials include (1) non-thermal treatment type antiferromagnetic materials that exhibit antiferromagnetic properties without thermal treatment and induce an exchange-coupling magnetic field with ferromagnetic material and (2) thermal treatment type antiferromagnetic materials that exhibit antiferromagnetic properties with thermal treatment. In the present invention, either type (1) or type (2) may be used. Non-thermal treatment type antiferromagnetic materials include RuRhMn, FeMn and IrMn. Thermal treatment type antiferromagnetic materials include PtMn, NiMn and PtRhMn.

The antiferromagnetic layer 22 is about 4~30 nm in thickness.

As a layer for pinning the magnetization direction of the magnetic pinned layer 30, a hard magnetic layer made of hard magnetic material such as CoPt may be disposed instead of the above-mentioned antiferromagnetic layer 22.

The foundation layer 21 formed beneath the antiferromagnetic layer 22 is a layer for enhancing crystallizability and orientation of each layer formed thereabove and is particularly provided for improving exchange-coupling between the antiferromagnetic layer 22 and the magnetic pinned layer 30. For such a foundation layer 21, a layered body of a Ta layer and a NiFe layer or a Ta Layer and a NiCr layer is used, for example. The foundation layer 21 is about 2~6 nm in thickness, for example.

(Explanation of Structure of Main Part of Thin Film Magnetic Head According to Present Invention)

In the thin film magnetic head according to the present invention, as shown in FIG. 1, the bias magnetic field application layers 6 are formed on the junction tapered parts P formed on the end parts of the MR effect film in the width direction (X direction) sequentially via the insulating layers 4 and the foundation layers 2. As shown in the drawing, the foundation layers 2 are disposed between the insulating layers 4 and the bias magnetic field application layers 6.

The main part of the thin film magnetic head according to the present invention lies in a combination of material compositions of the insulating layers 4 and the foundation layers 2. Particularly, the formula of the material composition in the insulating layers 4 is a novel one that has never been proposed in the prior art at all. Material for the bias magnetic field application layers 6 is taken into consideration in the main part as well.

Next, a description of each configuration is given below.

Explanation of Insulating Layers 4

The insulating layers 4 are configured of a Si oxide such that the Si content of the Si oxide is in the range of 30~56 at % (atom %) and preferably in the range of 35~55 at % (atom %). The atom ratio of oxygen to Si (O/Si) is in the range of 0.8~1.3 and preferably in the range of 0.81~1.28.

There occurs an inconvenience that the rate of occurrence of noise increases if both conditions that the Si content is in the range of 35~55 at % (atom %) and the atom ratio of oxygen to Si (O/Si) is in the range of 0.8~1.3 are not satisfied concurrently.

Regarding the Si oxide, at least one type selected from the group consisting of SiOx, SiOxN and SiAlOx is used.

The insulating layers 4 made of the Si oxide are observed to have not only the original insulating function but also the functions of controlling the crystallizability and orientation of the foundation layers 2 that are formed on the insulating layers 4 and are made of Cr or Cr alloy. Herein, the Si oxide contained in the insulating layers 4 include the above Si content and predetermined critical factors, for example the atom ratio of oxygen to Si (O/Si). In other words, it is assumed in the present invention that a distribution of crystal size (or particle diameter) and orientation of Cr crystals in an early growth stage is well controlled. Herein, the Cr crystals grow as centering oxygen that exists on a surface of the insulating layer 4.

Such insulating layers 4 should be not less than 1.5 nm in thickness. When only the function of controlling crystals of the foundation layers 2 formed on the insulating layers 4 is considered, there might be particularly no upper limit in the thickness of the insulating layers 4. However, the upper limit of thickness should be about 10 nm in consideration of a proper distance in view of designing the element structure.

Explanation of Foundation Layers 2

The foundation layers 2 are mainly used for controlling the crystallizability and orientation of the bias magnetic field application layers 6 and are configured of Cr or Cr alloy. The Cr alloy may include CrTi, CrMo, CrV, CrW and CrTa and so on.

Such foundation layers 4 should be not less than 1.5 nm in thickness and particularly about 2.0~6.5 nm in thickness.

Explanation of Bias Magnetic Field Application Layers 6

The bias magnetic field application layers 6 functions to apply a vertical magnetic field to the free layer and is configured of Co system hard magnetic layers. Particularly, it is preferable to use materials having a crystal structure of hexagonal system.

More specifically, CoPt, CoCrPt, CoCrTa or an alloy containing these materials as main components, should be used.

The thickness of the bias magnetic field application layers 6 should be not more than 20 nm, preferably 10 nm~20 nm and more preferably 12 nm~18 nm.

Explanation of the Second Embodiment

Next, a description of the second embodiment of the reproducing head (thin film magnetic head) having the MR element according to the present invention is given below by referring to FIG. 2.

The second embodiment as shown in FIG. 2 is fundamentally different from the first embodiment as shown in FIG. 1 in which insulating layers 4 in the second embodiment are configured of two layers and each of the layers is configured of a predetermined material. Otherwise, there is no substantial difference.

In other words, the insulating layers 4 in the second embodiment as shown in FIG. 2 have a two-layer structure of a lower insulating layer 4a and an upper insulating layer 4b sequentially from the junction tapered P side. The lower insulating layers 4a are configured of at least one type selected from the group consisting of $Al_2O_3$, AlN (aluminum nitride) and MgO (magnesium oxide), and the upper insulating layer 4 formed thereon is configured of a Si oxide. The Si oxide is substantially the same as those explained in the first embodiment as shown in FIG. 1. In other words, regarding the Si oxide used for the upper insulating layer 4, a Si content of the Si oxide is in the range of 30~56 at % (atom %), and an atom ratio of oxygen to Si (O/Si) is in the range of 0.8~1.3.

The lower insulating layer 4a and the upper insulating layer 4b should be each not less than 1.5 nm in thickness and particularly 1.5~5.0 nm. There occurs an inconvenience that the occurrence rate of noise increases or the resistance change rate of the element increases if either the lower insulating layer 4a or the upper insulating layer 4b is less than 1.5 nm.

The adoption of the insulating layers 4 having the two-layer structure made of predetermined materials as shown in FIG. 2 achieves an extremely superior effect in that the resistance change rate of the element is extremely low before and after the thermal treatment of the element (i.e., the thermal step such as annealing treatment). The reason why the element resistance changes before and after annealing treatment is believed that the oxygen composition ratio of the nonmagnetic layer 4 (i.e., made of $Al_2O_3$) in the MR effect film changes. It is assumed that oxygen is transferred between the nonmagnetic layer 40 and the insulating layers 4 during the thermal step. The oxygen transfer can be suppressed in the second embodiment. There occurs no problem of heat tolerance in the insulating layers 4 having only one layer in the first embodiment as shown in FIG. 1 above if the nonmagnetic layer 40 has a composition containing no oxygen.

(Explanation of Method of Producing Element Structure or Thereabout of Reproducing Head Having Main Part of Present Invention)

A description of a method of producing an element structure or thereabout of a reproducing head according to the present invention is schematically given below by referring to FIG. 3A~FIG. 3D and FIG. 4A~FIG. 4D.

FIG. 3A~FIG. 3D are sectional views particularly explaining a method of producing the element structural part of the reproducing head chronologically. FIG. 4A~FIG. 4D are each plan views explaining a method of producing the element structural part of the reproducing head.

In FIG. 3 and FIG. 4, drawings having the same alphabet specifying the drawings (e.g., FIG. 3A and FIG. 4A) show a sectional view and a plan view in the same step.

Figure 4A:
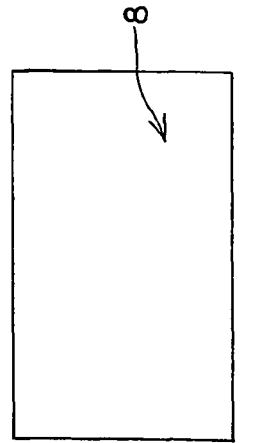
FIG. 4A~FIG. 4D are each plan views explaining a method of producing the element structural part of a reproducing head.
Figure 3A:
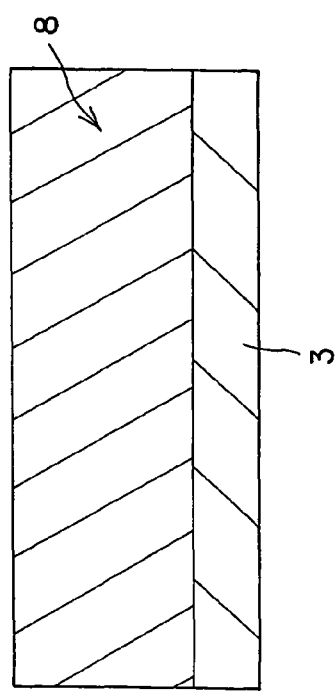
FIG. 3A~FIG. 3D are each sectional views particularly explaining a method of producing the element structural part of a reproducing head chronologically.

(1) Explanation of Step as Shown in FIG. 3A and FIG. 4A

Flat films of a foundation layer 21, an antiferromagnetic layer 22, a magnetic pinned layer 30, a nonmagnetic layer 40, a free layer 50 and a cap layer 26 (protecting layer 26) are sequentially layered so that a multi-layered flat film that is the foundation of an MR element 8 is formed.

In the drawing, the multi-layered flat film as the foundation of the MR element 8 is not shown as indicating the multi-layered structure but rather simply as a layer with the reference numeral 8 for the multi-layered film (also referred to as "MR film 8" below).

Figure 4B:
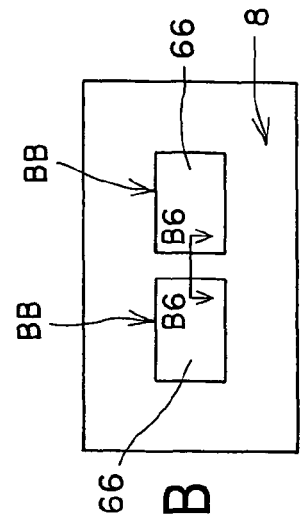
Figure 3B:
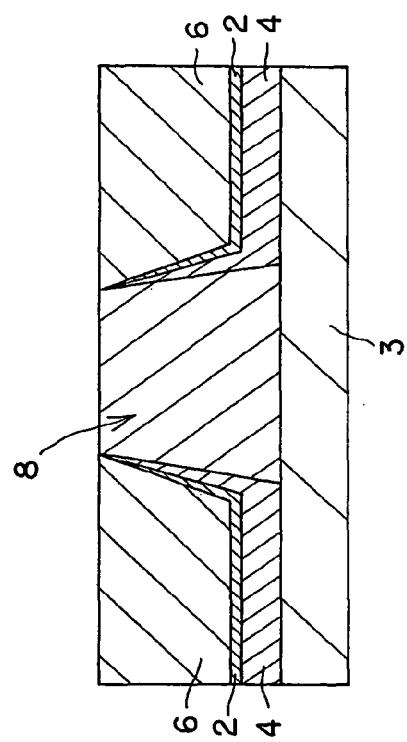

(2) Explanation of a Step as Shown in FIG. 3B and FIG. 4B

FIG. 3B is a sectional view on arrows taken by a B6-B6 line in FIG. 4B.

The MR film 8 is milled to form tracks of the MR film 8 as shown in FIG. 4B. In other words, the outside of two rectangular frames BB as shown in FIG. 4B is masked with a photoresist so that only inside of the frames can be exposed. The inside of the rectangular frames BB is removed by milling and dug up to the lower shield layer 3 to form concave parts.

Subsequently, the concave parts formed by milling are sequentially filled with insulating layers 4, foundation layers 2, bias magnetic field application layers 6 and protecting layers 66 for the bias magnetic field application layers. Then, a mask of the photoresist is lifted off (or removed) to result in the state as shown in FIG. 3B and FIG. 4B.

The insulating layers 4 may have a two-layer structure as shown in FIG. 2.

Figure 3C:
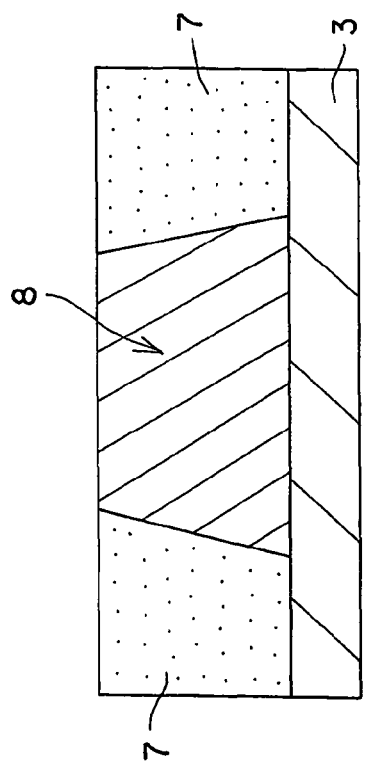
Figure 4C:
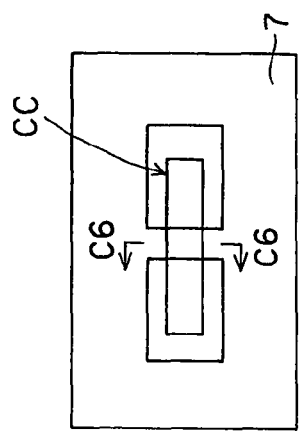

(3) Explanation of a Step as Shown in FIG. 3C and FIG. 4C

FIG. 3C is a sectional view on arrows taken along section lines C6-C6 in FIG. 4C.

In order to form a so-called MR height that is a depth length of the MR film 8 as shown in FIG. 4C, an inside of a rectangular frame CC in FIG. 4 is masked with a photoresist. Then, the unmasked portion that is outside the frame is removed by milling to the lower shield layer 3.

Subsequently, the insulating layer 7 is formed on the portions removed by milling. Then, the mask is lifted off to result in the state as shown in FIG. 3C and FIG. 4C. The element part is on the lower shield layer 3. With respect to the other portions, the insulating layer is formed on the substrate. In other words, the insulating layer 7 functions to electronically separate an element and is connected to the insulating layers 4.

Figure 3D:
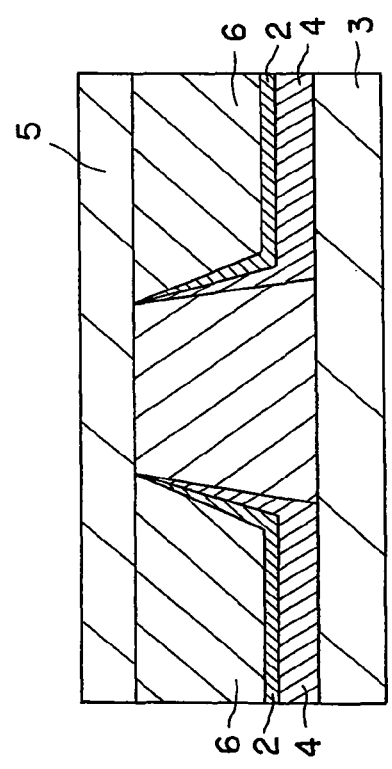
Figure 4D:
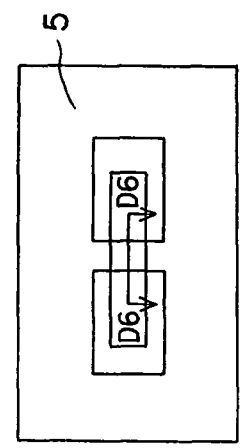

(4) Explanation of Step as Shown in FIG. 3D and FIG. 4D

FIG. 3D is a sectional view along section lines a D6-D6 in FIG. 4D.

The upper shield layer 5 (i.e., the upper shield that also serves as the upper electrode) is formed to result in the state as shown in FIG. 3D and FIG. 4D.

(Explanation of Overall Configuration of Thin Film Magnetic Head)

A description of the schematic overall configuration of the above-mentioned thin film magnetic head is given below.

FIG. 5 shows a sectional view (i.e., a cross section taken in a Y-Z plane) of a thin film magnetic head that is disposed parallel to the so-called ABS.

A thin film magnetic head 100 as shown in FIG. 5 is mounted on a magnetic recording device such as a hard disk drive in order to magnetically treat a recording medium 10 such as a hard disk that moves in the traveling direction M of the medium.

The thin film magnetic head 100 as shown in the figures is a so-called complex type head that is feasible to execute both recording processes (or writing processes) and reproducing processes (reading processes) as magnetic processes. As shown in FIG. 7, the structure is such that a magnetic head part 101 is formed on a slider substrate configured of ceramic materials such as AlTic ($Al_2O_3.TiC$).

The configuration of the magnetic head part 101 is such that a reproducing head 100A for reproducing magnetic information recorded using the MR effect and a shield-type recording head part 100B for executing recording treatment in the perpendicular recording system, for example, are layered on each other.

A description is given below in more detail.

A first shield layer 3 and a second shield layer 5 are flat layers formed in a manner of being substantially parallel to the side surface 1a of the slider substrate 1. These layers 3 and 5 form part of ABS that is the medium-opposed surface 70.

The MR element 8 is disposed in a manner of being sandwiched between the first shield layer 3 and the second shield layer 5, forming part of the medium-opposed surface 70. The height in the perpendicular direction (Y direction) of the medium-opposed surface 70 is the MR height (MR-h).

The first shield layer 3 and the second shield layer 5 may be formed by a pattern plating method including a frame plating method, for example.

The MR element 8 is a layered film formed in a manner of being substantially parallel to the side surface 1a of the slider substrate 1, configuring part of the medium-opposed surface 70.

The MR element 8 is a CPP type layered film that allows a sense current to flow in the direction perpendicular to its layering surface.

As shown in FIG. 5, an interelement shield layer 9 made of the same material as that of the second shield layer 5 is formed between the second shield layer 5 and the recording head part 100B.

The interelement layer 9 functions in a manner of shielding the MR element 8 that functions as a sensor from a magnetic field generated by the recording head part 100B, thereby blocking exogenous noise at the time of reading. A bucking coil part may also be formed between the interelement layer 9 and the recording head part 100B. The bucking coil part generates magnetic flux that overrides a magnetic flux loop that is generated by the recording head part 100B and passes through the upper and lower electrode layers of the MR element 8 and, therefore, acts in a manner of suppressing unnecessary writing to a magnetic disk or wide area adjacent tracks erasing (WATE) phenomena that are erasing operations.

Insulating layers 7 and 44 are formed in the gap between the first shield layer 3 and the second shield layer 5 on the side opposite the medium-opposed surface 70 of the MR element 8; in the posterior region between the first and second shield layers 3 and 5 and the interelement shield layer 9 on the side opposite the medium-opposed surface 70; in the gap between the first shield layer 3 and the slider substrate 1; and in the gap between the interelement shield layer 9 and the recording head part 100B.

The recording head part 100B is preferably configured for perpendicular magnetic recording and, as shown in FIG. 5, includes a main magnetic pole layer 15, a gap layer 18, a coil insulating layer 26, a coil layer 23 and an auxiliary magnetic pole layer 25. Needless to say, a perpendicular recording mechanism may be replaced with a longitudinal recording mechanism.

The main magnetic pole layer 15 is configured to be a leading magnetic path for leading and focusing magnetic flux initiated by the coil layer 23 to the recording layer of a magnetic recording medium 10 to be written. It is preferred that the end part of the main magnetic pole layer 15 on the side of the medium-opposed surface 70 should be smaller in thickness compared with other portions in the track width direction (i.e., the direction along the X-axis in FIG. 5) and in the layering direction (i.e., the direction along the Z-axis in FIG. 5). As a result, it is possible to generate a magnetic field for minute and strong writing corresponding to high recording density.

A trailing shield part that has a wider layer cross section than the other portions of the auxiliary magnetic layer 25 is formed on the end part of the auxiliary magnetic pole layer 25 magnetically coupled with the main magnetic pole layer 15 on the side of the medium-opposed surface 70. As shown in FIG. 5, the auxiliary magnetic pole layer 25 is disposed in a manner of being opposed to the end part of the main magnetic pole layer 15 on the side of the medium-opposed surface 70 via the gap layer 18 made of insulating material such as alumina and the coil insulating layer 26.

The auxiliary magnetic pole layer 25 makes the magnetic field gradient steep. The magnetic field gradient is referred to as a value observed between the auxiliary magnetic pole layer 25 and the main magnetic pole layer 15 in the vicinity of the medium-opposed surface 70. As a result, signal output jitter is reduced, thereby making the error rate smaller at the time of reading.

The auxiliary magnetic pole layer 25 is formed to about 0.5~5 μm in thickness by a frame plating method, a sputtering method or the like, for example. Employed material may be an alloy made of two or three elements selected from the group consisting of Ni, Fe and Co, for example, or an alloy made of these elements, as main components, plus predetermined chemical elements.

The gap layer 18 is formed in order to separate the coil layer 23 from the main magnetic pole layer 15. The gap layer 18 may be formed by a sputtering method, a CVD method or the like, for example, and may have a thickness of about 0.01~0.5 μm and be configured of $Al_2O_3$, diamond-like carbon (DLC) or the like.

[Explanation of Head Gimbal Assembly and Hard Disk Device]

Next, a head gimbal assembly on which the above-mentioned thin film head is mounted and one embodiment of a hard disk device are described below.

First, a description of a slider 210 equipped with the head gimbal assembly is illustrated in FIG. 6. In the hard disk device, the slider 210 is disposed in a manner of being opposed to a hard disk that is a rotatably driven disk-like recording medium. The slider 210 is provided with a base substrate 211 mainly configured of a substrate and an overcoat.

The base substrate 211 is substantially hexahedronal. Of the six surfaces of the base substrate 211, one surface is disposed in a manner of being opposed to a hard disk. The medium-opposed surface 70 is formed on the surface.

When a hard disk is rotated in the z direction in FIG. 6, an airflow passing between the hard disk and the slider 210 creates lifting power downwardly in the y direction in FIG. 6. The slider 210 floats from the surface of the hard disk by this lifting power. The x direction in FIG. 6 is the track traversing direction of the hard disk.

In the vicinity of the end part of the slider 210 on the air exit side (i.e., the end part on the lower left in FIG. 6), the thin film magnetic head according to the present embodiment is formed.

Next, a description of the head gimbal assembly 220 according to the present embodiment is described by referring to FIG. 7. The head gimbal assembly 220 is provided with the slider 210 and a suspension 221 for elastically supporting the slider 210. The suspension 221 has a plate spring load beam 222 formed of stainless steel, a flexure 223 that is provided on one end part of the load beam 222 and joined with the slider 210 in a manner of giving the slider 210 a proper degree of freedom, and a base plate 224 provided on the other end part of the load beam 222.

The base plate 224 is mounted on an arm 230 of an actuator for moving the slider 210 in the track traversing direction x of the hard disk 262. The actuator has the arm 230 and a voice coil motor for driving the arm 230. A gimbal part is provided for keeping a posture of the slider 210 constant on the portion of the flexure 223 on which the slider 210 is mounted.

The head gimbal assembly 220 is mounted on the arm 230 of the actuator. One arm 230 with a head gimbal assembly 220 mounted thereon is called a head arm assembly. A carriage having multiple arms, each of which has a head gimbal assembly mounted thereon, is called a head stack assembly.

FIG. 7 shows one embodiment of a head arm assembly. In this head arm assembly, a head gimbal assembly 220 is mounted on one end part of the arm 230. A coil 231, part of a voice coil motor, is mounted on the other end part of the arm 230. A bearing part 233 is provided in the middle part of the arm 230 so that a shaft 234 is rotatably supported.

Figure 8:
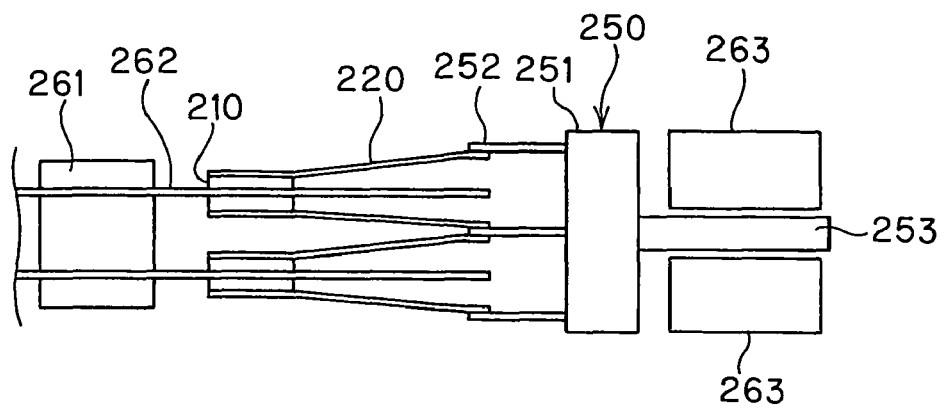
FIG. 8 is an explanatory view illustrating the main parts of the magnetic disk device according to one embodiment of the present invention.
Figure 9:
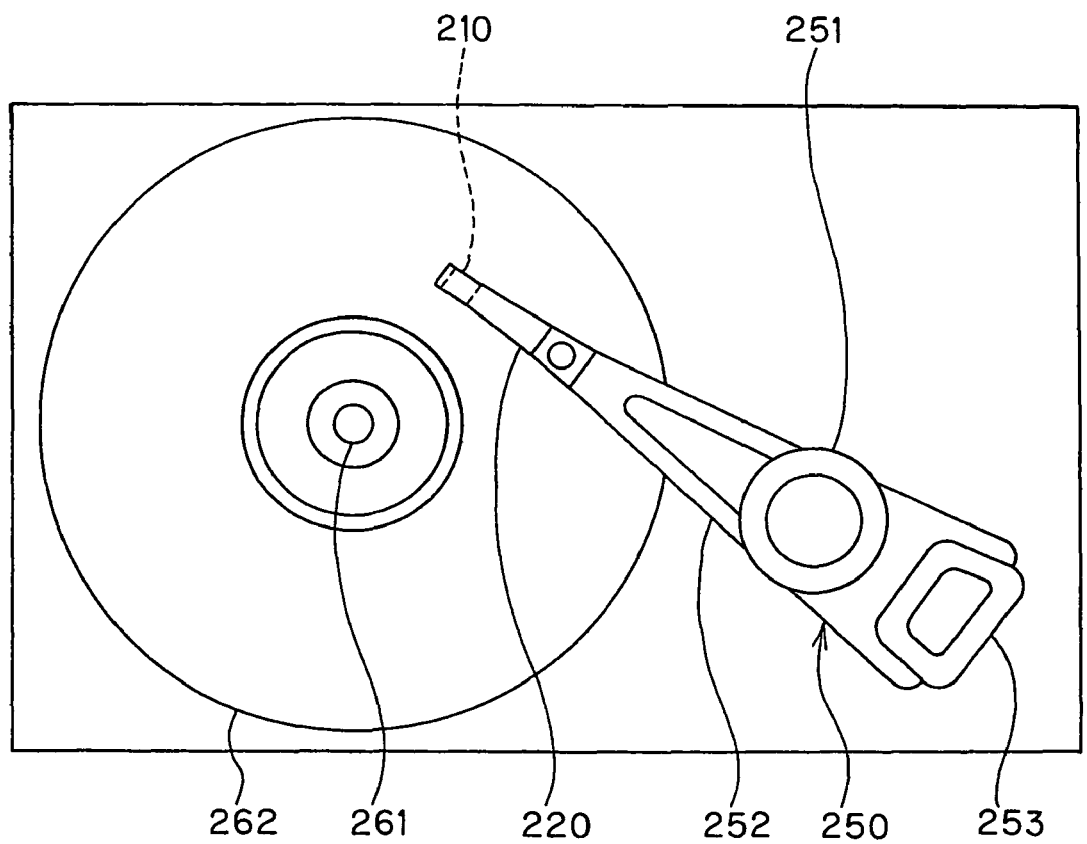
FIG. 9 is a plan view illustrating the main parts of the magnetic disk device according to one embodiment of the present invention.

A description of one example of the head stack assembly and the hard disk device according to the present embodiment is described by referring to FIG. 8 and FIG. 9.

FIG. 8 is an explanatory view illustrating the main part of a hard disk device. FIG. 9 is a plan view of the hard disk device.

The head stack assembly 250 has a carriage 251 having multiple arms 252. On the multiple arms 252 are mounted multiple head gimbal assemblies 220 in the perpendicular direction at certain intervals. A coil 253, part of a voice coil motor, is mounted on the opposite side of the arms 252 in the carriage 251. The head stack assembly 250 is incorporated into a hard disk device.

A hard disk device has multiple hard disks 262 mounted on a spindle motor 261. Two sliders 210 are disposed for each hard disk 262 in a manner of being opposed to each other by sandwiching the hard disk 262. The voice coil motor has permanent magnets 263 disposed in a manner of being opposed to each other by sandwiching the coil 253 of the head stack assembly 250.

The head stack assembly 250 and an actuator except for sliders 210 support as well as locate the slider relative to the hard disk 22 corresponding to a positioning device of the present invention.

In the hard disk device according to the present embodiment, an actuator allows moving sliders 210 in the track traversing direction of the hard disk 262 in order to position sliders 210 relative to the hard disk 262. Thin film magnetic heads included in sliders 210 record information on the hard disk 262 by the recording head and reproduce (or read) information recorded in the hard disk 262 by the reproducing head.

The head gimbal assembly and hard disk device according to the present embodiment are as effective as the thin film magnetic head according to the above-mentioned embodiment.

In the embodiment, it is explained that a thin film magnetic head has a structure of a reproducing head part formed on the base substrate side and a perpendicular recording head part layered thereon. However, the layering order may be reversed. Moreover, the configuration may be such that only a reproducing part is provided in the case of a reproduction-only thin film head.

Embodiments

A description of the above-mentioned present invention is described in more detail by referring to exemplary embodiments as shown below.

Experimental Embodiment I

On a 6-inch substrate, a thin film magnetic head having an MR element for reading was made by the following procedure. The main portion of the thin film magnetic head is manufactured by the procedure as shown in FIG. 3A~FIG. 3D and FIG. 4A~FIG. 4D.

(1) Multi-Layered Film Body Forming Step

On the substrate, a first shield layer 3 was formed. On the first shield layer 3, a foundation layer 21, an antiferromagnetic layer 22, a magnetic pinned layer 30, a nonmagnetic layer 40, a free layer 50 and a cap layer 26 (a protecting layer 26) as flat films were sequentially formed according to the multi-layered film specification as shown in the following Table 1 (See FIG. 3A).

TABLE 1

| Layered structure | | Layer forming materials | Thickness (nm) |
|---|---|---|---|
| Cap layer (26) | | Ta | 4.0 |
| Free layer (50) | | NiFe | 3.0 |
| | | CoFe | 1.0 |
| Nonmagnetic layer (40) | | $Al_2O_3$ | 0.6 |
| Magnetic pinned layer (30) | Inner layer | CoFe | 2.5 |
| | Nonmagnetic intermediate layer | Ru | 0.8 |
| | Outer layer | CoFe | 2.0 |
| Antiferromagnetic layer (22) | | IrMn | 7.0 |
| Foundation layer (21) | | Ru | 2.0 |
| | | Ta | 1.5 |

Next, as shown in FIG. 3B, insulating layers 4, foundation layers 2 and bias magnetic field application layers 6 were formed at the junction tapered parts formed on both end parts of the MR film in the width direction.

As the insulating layers 4, the insulating layers included various compositions and were 4 nm in a thickness as shown in Table 2 below. In other words, four types of targets ($Al_2O_3$, $SiO_2$, SiON and SiAlON) were used in order to form the layers by sputtering. The insulating layers 4 having diverse composition ratios as shown in Table 2 below were formed with a mixed gas of Ar and oxygen as process gas, further by changing the flow rate of oxygen.

Cr layers having a thickness of 4 nm were formed as the foundation layers 2 on the insulating layers 4 CoPt layers having a thickness of 20 nm were formed as the bias magnetic field application layers 6 on the foundation layers 2. The upper shield layer 5 (i.e., the upper shield that also serves as the upper electrode) was formed thereon. Various samples as shown in Table 2 below were prepared.

In order to evaluate an ability of the bias magnetic field application layers 6 to control (or restrain) a magnetic domain of the free layer for each sample, the noise occurrence rates (%) were examined. The noises were caused by discontinuous changes of a magnetization direction in the free layer in response to changes in the external magnetic field. The noise occurrence rates (%) were measured by a method as shown below.

(1) Noise Occurrence Rates (%)

Reproduced output waveforms of 200 elements were measured at 900 MHz frequency for 30 seconds. An element was defined as a noise generation element when the counted number of waveforms was 10 or greater. The waveforms exhibited outputs equal to or 125% more than the average output. A percentage of elements determined as the noise generation elements among the 200 elements was defined as the noise occurrence rate (%).

Table 2 below shows the measured results.

TABLE 2

| | Film forming method | | Composition of insulating film 4 | | | | | |
|---|---|---|---|---|---|---|---|---|
| Sample No. | Target | Flow rate of oxygen (sccm) | Si (at %) | Al (at %) | O (at %) | N (at %) | O/Si ratio (—) | Noise occurrence rate (%) |
| 1-1 | $SiO_2$ | 2.5 | 55 | — | 45 | — | 0.81 | 2.4 |
| 1-2 | $SiO_2$ | 15 | 44 | — | 56 | — | 1.27 | 3.8 |
| 1-3 (Comparative Embodiment) | $SiO_2$ | 30 | 37 | — | 63 | — | 1.70 | 9.9 |
| 1-4 (Comparative Embodiment) | $SiO_2$ | 45 | 33.8 | — | 66.2 | — | 1.96 | 12.7 |
| 1-5 (Comparative Embodiment) | SiON | 0 | 52 | — | 8 | 40 | 0.15 | 13.9 |
| 1-6 (Comparative Embodiment) | SiON | 15 | 47 | — | 23 | 30 | 0.49 | 10.9 |
| 1-7 | SiON | 30 | 40 | — | 37 | 23 | 0.93 | 2.9 |

TABLE 2-continued

|  | Film forming method | | Composition of insulating film 4 | | | | | |
|---|---|---|---|---|---|---|---|---|
| Sample No. | Target | Flow rate of oxygen (sccm) | Si (at %) | Al (at %) | O (at %) | N (at %) | O/Si ratio (—) | Noise occurrence rate (%) |
| 1-8 (Comparative Embodiment) | SiAlON | 10 | 42 | 32 | 13 | 13 | 0.31 | 11.2 |
| 1-9 (Comparative Embodiment) | SiAlON | 25 | 38 | 30 | 24 | 8 | 0.63 | 9.4 |
| 1-10 | SiAlON | 40 | 35 | 28 | 30 | 7 | 0.86 | 3.2 |
| 1-11 (Comparative Embodiment) | $Al_2O_3$ | 30 | — | 39 | 61 | — | ∞ | 14.2 |

The effect of the present invention is obvious based on the results as shown in Table 2.

In the above-mentioned experimental embodiment, the thickness of the insulating layers 4 was limited to 4 nm. It has been confirmed, however, that the same effect as shown in Table 2 above can be achieved with the insulating layers 4 having a thickness in the range of 1.5~8.0 nm. Likewise, the thickness of the foundation layers 2 was limited to 4 nm in the above-mentioned experimental embodiment. It has been confirmed, however, that the same effect as shown in Table 2 above can be achieved with the foundation layers 2 having a thickness in the range of 2.0~6.5 nm.

Moreover, it has been confirmed that the same effect as shown in Table 2 above can be achieved by replacing CoPt used for the bias magnetic field application layers 6 with CoCrPt, or CoCrTa.

Furthermore, it has been confirmed that the same effect as shown in Table 2 above can be achieved by replacing Cr used for the foundation layers 2 with CrTi, CrW, CrMo or CrTa.

Experimental Embodiment II

A thin film magnetic head having an MR element for reproducing with a structure shown in FIG. 2 was on a 6-inch substrate. In other words, the insulating layers 4 having only one layer were changed into the insulating layers 4 having two layers configured of a lower insulating layer 4a and an upper insulating layer 4b. The thicknesses of the two layers of the insulating layers were also diversified as shown in Table 3 below.

A composition of the lower insulating layers 4a was formed using alumina as a target and, was the same as a composition of the insulating layer in Sample No. 1-11 (referred to as "Composition 11" below) in Table 2 above. On the other hand, a composition of the upper insulating layers 4b was the same as a composition of the insulating layer in Sample No. 1-2 (referred to as "Composition 2" below), Sample No. 1-7 (referred to as "Composition 7" below) and Sample No. 1-10 (referred to as "Composition 10" below) in Table 2 above.

For each sample in Experimental Embodiment II, (1) the noise occurrence rate (%) and (2) the change rate of element resistance (%) before and after annealing were measured. (1) the noise occurrence rates (%) were measured by the same procedure as explained in the above-mentioned Experimental Embodiment I. (2) the change rates of element resistance (%) before and after annealing were measured by the procedure as shown below.

The element resistances before annealing treatment as well as the element resistance after annealing treatment were measured, then the change rates of element resistance (%) were measured by the following equation (1). The conditions for the annealing treatment were 250° C. and two hours.

Change rate of element resistance (%)=[(MRR1−MRR2)/MRR1]×100     (1)

wherein, MRR1 is an element resistance before annealing treatment; and MRR2 is an element resistance after annealing treatment.

Table 3 below shows the results.

TABLE 3

| | Lower insulating layer 4a | | Upper insulating layer 4b | | Noise occurrence | Change rate of element |
|---|---|---|---|---|---|---|
| Sample No. | Composition | Thickness (nm) | Composition | Thickness (nm) | rate (%) | resistance (%) |
| 11-1 (Comparative Embodiment) | Composition 11 (AlOx) | 0.5 | Composition 2 (SiOx) | 3.5 | 3.6 | 17.2 |
| 11-2 | Composition 11 (AlOx) | 1.5 | Composition 2 (SiOx) | 2.5 | 3.9 | 2.4 |
| 11-3 | Composition 11 (AlOx) | 2.5 | Composition 2 (SiOx) | 1.5 | 3.2 | −1.2 |
| 11-4 (Comparative Embodiment) | Composition 11 (AlOx) | 3.5 | Composition 2 (SiOx) | 0.5 | 8.7 | −0.2 |
| 1-2 (Reference) | | | Composition 2 (thickness: 4 nm) | | 3.8 | 22.2 |
| 11-5 (Comparative Embodiment) | Composition 11 (AlOx) | 0.5 | Composition 7 (SiOxN) | 3.5 | 3.1 | 18.0 |
| 11-6 | Composition 11 (AlOx) | 1.5 | Composition 7 (SiOxN) | 2.5 | 2.8 | 1.5 |
| 11-7 | Composition 11 (AlOx) | 2.5 | Composition 7 (SiOxN) | 1.5 | 3.4 | 2.0 |

TABLE 3-continued

| Sample No. | Lower insulating layer 4a Composition | Thickness (nm) | Upper insulating layer 4b Composition | Thickness (nm) | Noise occurrence rate (%) | Change rate of element resistance (%) |
|---|---|---|---|---|---|---|
| 11-8 (Comparative Embodiment) | Composition 11 (AlOx) | 3.5 | Composition 7 (SiOxN) | 0.5 | 11.5 | 0.3 |
| 1-7 (Reference) | Composition 7 (thickness: 4 nm) | | | | 2.9 | 18.9 |
| 11-9 (Comparative Embodiment) | Composition 11 (AlOx) | 0.5 | Composition 10 (SiAlOxN) | 3.5 | 2.9 | 13.8 |
| 11-10 | Composition 11 (AlOx) | 1.5 | Composition 10 (SiAlOxN) | 2.5 | 3.2 | −0.7 |
| 11-11 | Composition 11 (AlOx) | 2.5 | Composition 10 (SiAlOxN) | 1.5 | 3.3 | 1.1 |
| 11-12 (Comparative Embodiment) | Composition 11 (AlOx) | 3.5 | Composition 10 (SiAlOxN) | 0.5 | 10.1 | −0.2 |
| 1-10 (Reference) | Composition 10 (thickness: 4 nm) | | | | 3.2 | 17.1 |

The effect of the insulating layers 4 having a two-layer structure according to the present invention is obvious based on the experimental results as shown in Table 3.

Based on the above-mentioned experimental results, the effect of the present invention is obvious. In other words, the noise occurrence rate is reduced partly because the foundation layers of the thin film magnetic head according to the present invention are disposed between the insulating layers and the bias magnetic field application layers and are configured of Cr or Cr alloy and partly, further because the insulating layers are configured of a Si oxide such that the Si content of the Si oxide is in the range of 30~56 at % (atom %) and that the atom ratio of oxygen to Si (O/Si) is in the range of 0.8~1.3.

In addition to a reduced noise occurrence rate, the thin film magnetic head according to the present invention can achieve an extremely superior effect in thermal stability after annealing treatment for the following reasons: the foundation layers are disposed between the insulating layers and the bias magnetic field application layers and are configured of Cr or Cr alloy, the insulating layers have a two-layer structure of a lower insulating layer and an upper insulating layer; the lower insulating layers are configured of at least one type selected from the group consisting of $Al_2O_3$, AlN and MgO; the upper insulating layers are configured of a Si oxide such that the Si content of the Si oxide is in the range of 30~56 at % (atom %) and that the atom ratio of oxygen to Si (O/Si) is in the range of 0.8~1.3; and the lower insulating layers and the upper insulating layers both are 1.5 nm or greater in thickness.

As the industrial feasibility of the present invention, the present invention can be used in the industry of magnetic disk devices equipped with an MR effect element for reading the magnetic intensity of magnetic recording media and the like as signals.

What is claimed is:

1. A thin film magnetic head comprising:
   a magneto-resistive (MR) effect element comprising:
      an MR effect film formed by sequentially layering a magnetic pinned layer, a nonmagnetic layer and a free layer, and
   bias magnetic field application layers formed at junction tapered parts formed on both end parts of the MR effect film in a width direction via insulating layers and foundation layers, wherein
   the free layer is configured to change its magnetization direction in accordance with an external magnetic field,
   a magnetization direction of the magnetic pinned layer is pinned, and
   the bias magnetic field application layers are configured to apply a vertical bias magnetic field to the free layer,
   the foundation layers are disposed between the insulating layers and the bias magnetic field application layers, and are configured of Cr or Cr alloy, and
   the insulating layers are configured of a Si oxide such that the Si content of the Si oxide is in the range of 30~56 at % (atom %) and that the atom ratio of oxygen to Si (O/Si) is in the range of 0.8~1.3.

2. The thin film magnetic head of claim 1, the Si oxide is at least one type selected from the group consisting of SiOx, SiOxN and SiAlOxN.

3. The thin film magnetic head of claim 1, wherein the foundation layers are at least one type selected from the group consisting of Cr, CrTi, CrMo, CrV, CrW and CrTa.

4. The thin film magnetic head of claim 1, wherein the insulating layers are 1.5~10 nm in thickness.

5. The thin film magnetic head of claim 1, wherein the foundation layers are 1.5~6.5 nm in thickness.

6. The thin film magnetic head of claim 1, wherein the bias magnetic field application layers are configured of Co system hard magnetic layers.

7. The thin film magnetic head of claim 1, wherein the bias magnetic field application layers are 10~20 nm in thickness.

8. A thin film magnetic head comprising:
   a magneto-resistive (MR) effect element comprising:
      an MR effect film formed by sequentially layering a magnetic pinned layer, a nonmagnetic layer and a free layer; and
   bias magnetic field application layers formed at junction tapered parts formed on both end parts of the MR effect film in a width direction via insulating layers and foundation layers; wherein
   the free layer is configured to change magnetization directions in accordance with an external magnetic field,
   a magnetization direction of the magnetic pinned layer is pinned,
   the bias magnetic field application layers are configured to apply a vertical bias magnetic field to the free layer,
   the foundation layers are disposed between the insulating layers and the bias magnetic field application layers, and are configured of Cr or Cr alloy, the insulating layers have a two-layer structure of a lower insulating layer and a upper insulating layer sequentially viewed from the junction tapered part side, the lower insulating layers are configured of at least one type selected from the group consisting of $Al_2O_3$, AlN and MgO, the upper insulating layers are configured of a Si oxide such that the Si content of the Si oxide is in the range of 30~56 at % (atom %) and that the atom ratio of oxygen to Si (O/Si) is in the range of 0.8~1.3, and thicknesses of the lower insulating layers and the upper insulating layers are each not less than 1.5 nm.

9. The thin film magnetic head of claim 8, wherein the thicknesses of the lower insulating layers and the upper insulating layers are each in the range of 1.5 nm~5.0 nm.

10. The thin film magnetic head of claim 8, wherein the Si oxide configuring the upper insulating layers is at least one type selected from the group consisting of SiOx, SiOxN and SiAlOxN.

11. The thin film magnetic head of claim 1, wherein the foundation layers are at least one type selected from the group consisting of Cr, CrTi, CrMo, CrV, CrW and CrTa.

12. A head gimbal assembly comprising:

a slider comprising the thin film magnetic head according to claim 1 or 8, and disposed in a manner of being opposed to a recording medium, and a suspension for elastically supporting the slider.

13. A magnetic disk device comprising:

a slider comprising the thin film magnetic head according to claim 1 or 8, and disposed in a manner of being opposed to a recording medium, and a positioning device for supporting and positioning the slider with respect to the recording medium.

* * * * *